United States Patent
Li et al.

(10) Patent No.: US 10,499,496 B2
(45) Date of Patent: Dec. 3, 2019

(54) LENGTH- AND WIDTH-DEFORMABLE PRINTED CIRCUIT BOARD AND METHOD FOR MANUFACTURING THE SAME

(71) Applicants: Avary Holding (Shenzhen) Co., Limited., Shenzhen (CN); HongQiSheng Precision Electronics (QinHuangDao) Co., Ltd., Qinhuangdao (CN)

(72) Inventors: Wei-Xiang Li, Shenzhen (CN); Ming-Liang Zuo, Shenzhen (CN)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 0 days.

(21) Appl. No.: 15/701,758

(22) Filed: Sep. 12, 2017

(65) Prior Publication Data
US 2018/0110118 A1    Apr. 19, 2018

(30) Foreign Application Priority Data

Oct. 14, 2016    (CN) .......................... 2016 1 0900164

(51) Int. Cl.
| H05K 3/40 | (2006.01) |
| H05K 3/42 | (2006.01) |
| H05K 1/02 | (2006.01) |
| H05K 1/03 | (2006.01) |
| H05K 1/11 | (2006.01) |

(Continued)

(52) U.S. Cl.
CPC ......... *H05K 1/0283* (2013.01); *H05K 1/0326* (2013.01); *H05K 1/115* (2013.01); *H05K 3/16* (2013.01); *H05K 3/188* (2013.01); *H05K 3/4038* (2013.01); *H05K 3/426* (2013.01); *H05K 2201/0959* (2013.01)

(58) Field of Classification Search
CPC ........ H05K 3/188; H05K 3/16; H05K 3/4038; H05K 1/0283; H05K 1/115; H05K 1/0326; H05K 3/426; H05K 2201/0959; Y10T 29/49165
USPC .......................................... 29/852, 846, 829
See application file for complete search history.

(56) References Cited

U.S. PATENT DOCUMENTS

| 5,252,195 A | * | 10/1993 | Kobayashi | ............. | H05K 3/428 |
| | | | | | 205/126 |
| 5,421,083 A | * | 6/1995 | Suppelsa | .............. | H05K 1/0222 |
| | | | | | 174/250 |

(Continued)

FOREIGN PATENT DOCUMENTS

| CN | 1165608 A | 11/1997 |
| CN | 100433321 C | 11/2008 |
| CN | 205336645 U | 6/2016 |

*Primary Examiner* — Peter Dungba Vo
*Assistant Examiner* — Kaying Kue
(74) *Attorney, Agent, or Firm* — ScienBiziP, P.C.

(57) ABSTRACT

A length- and width-deformable printed circuit board includes a first conductive circuit layer, an elastic film, and a plurality of conductive via holes. The first conductive circuit layer includes a plurality of first conductive circuits. The plurality of first conductive circuits is embedded in the elastic film. The first conductive circuit layer have a plurality of first honeycomb hole. Each of the plurality of conductive via holes corresponds to one of the first honeycomb holes.

6 Claims, 3 Drawing Sheets

(51) Int. Cl.
*H05K 3/16* (2006.01)
*H05K 3/18* (2006.01)

(56) References Cited

U.S. PATENT DOCUMENTS

| | | | | |
|---|---|---|---|---|
| 5,745,333 | A * | 4/1998 | Frankeny | H05K 1/162 |
| | | | | 361/301.4 |
| 6,035,527 | A * | 3/2000 | Tamm | H05K 3/027 |
| | | | | 205/126 |
| 6,204,453 | B1 * | 3/2001 | Fallon | H05K 3/44 |
| | | | | 174/255 |
| 6,727,645 | B2 * | 4/2004 | Tsujimura | H01L 27/3246 |
| | | | | 257/40 |
| 7,968,918 | B2 * | 6/2011 | Kim | H01L 21/76898 |
| | | | | 257/276 |
| 8,557,629 | B1 * | 10/2013 | Kim | H01L 23/3128 |
| | | | | 438/106 |
| 2007/0212521 | A1 * | 9/2007 | Bessho | H01R 13/2414 |
| | | | | 428/137 |
| 2008/0277148 | A1 | 11/2008 | Asai et al. | |
| 2013/0296664 | A1 * | 11/2013 | Frey | A61B 5/14532 |
| | | | | 600/309 |
| 2015/0099959 | A1 * | 4/2015 | Bonmassar | A61N 1/0531 |
| | | | | 600/377 |

* cited by examiner

LENGTH- AND WIDTH-DEFORMABLE PRINTED CIRCUIT BOARD AND METHOD FOR MANUFACTURING THE SAME

FIELD

The subject matter generally relates to a printed circuit board, and more particularly, to a length- and width-deformable printed circuit board and method for manufacturing the same.

BACKGROUND

Flexible printed circuits are widely used in various kinds of electronic devices. Although the flexible printed circuit can bend to an extent, it cannot be stretched, which would cause cracks and signal transmission instability in the circuit.

BRIEF DESCRIPTION OF THE DRAWINGS

Implementations of the present disclosure will now be described, by way of example only, with reference to the attached figures.

DETAILED DESCRIPTION OF EMBODIMENTS

Figure 1:
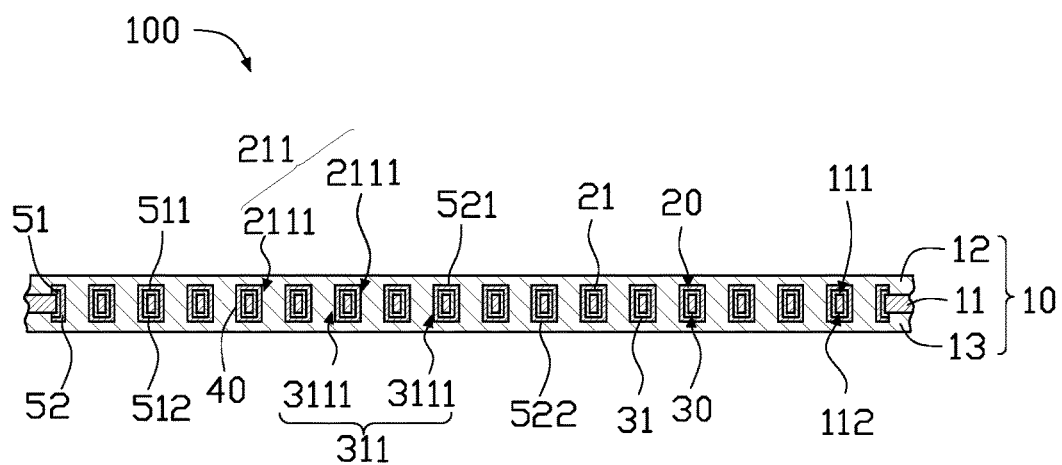
FIG. 1 is a cross-sectional view of an exemplary embodiment of a length- and width-deformable printed circuit board of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean at least one.

The term "comprising" when utilized, means "including, but not necessarily limited to"; it specifically indicates open-ended inclusion or membership in the so-described combination, group, series, and the like.

Figure 2:
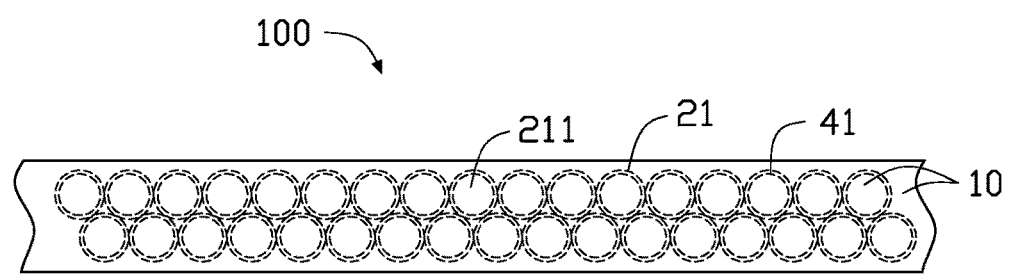
FIG. 2 is a top view of the length- and width-deformable printed circuit board of FIG. 1.

FIG. 1 and FIG. 2 illustrate an exemplary embodiment of a length- and width-deformable printed circuit board 100. The length- and width-deformable printed circuit board 100 can be a single-sided printed circuit board, a multi-layered flexible printed circuit board, a multi-layered IC carrier, or a multi-layered rigid-flexible printed circuit board.

In at least one exemplary embodiment, the length- and width-deformable printed circuit board 100 is a double-layered printed circuit board. The length- and width-deformable printed circuit board 100 includes an elastic film 10, a first conductive circuit layer 20, and a second conductive circuit layer 30. The first conductive circuit layer 20 and the second conductive circuit layer 30 are embedded in the elastic film 10.

The elastic film 10 includes an elastic base layer 11, a first elastic cover layer 12, and a second elastic cover layer 13. The elastic base layer 11 includes a first surface 111 and a second surface 112 facing away from the first surface 111. The first conductive circuit layer 20 is formed on the first surface 111. The second conductive circuit layer 30 is formed on the second surface 112. The elastic base layer 11, the first conductive circuit layer 20 and the second conductive circuit layer 30 are sandwiched between the first elastic cover layer 12 and the second elastic cover layer 13.

The elastic base layer 11, the first elastic cover layer 12, and the second elastic cover layer 13 are electrically insulated from each other.

In at least one exemplary embodiment, the elastic base layer 11, the first elastic cover layer 12, and the second elastic cover layer 13 can be made of polydimethylsiloxane (PDMS).

In at least one exemplary embodiment, the first conductive circuit layer 20 includes a part of a metal layer 51 on the first surface 111 and a part of an electroplated copper layer 52 formed on the metal layer 51.

The metal layer 51 includes a third surface 511 and a fourth surface 512 facing away from the third surface 511, the third surface 511 faces away from the first surface 111 and on the same side with the first surface 111, the fourth surface 512 faces away from the second surface 112 and on the same side with the second surface 112.

In at least one exemplary embodiment, the second conductive circuit layer 30 includes another part of the metal layer 51 on the second surface 112 and another part of the electroplated copper layer 52 formed on the metal layer 51.

The electroplated copper layer 52 includes a fifth surface 521 and a sixth surface 522 facing away from the fifth surface 521. The fifth surface 521 faces away from the third surface 511 and on the same side with the first surface 111 and the third surface 511. The sixth surface 522 faces away from the fourth surface 512 and on the same side with the fourth surface 512 and the second surface 112. The first elastic cover layer 12 is covered on the fifth surface 521 of the electroplated copper layer 52. The second elastic cover layer 13 is covered on the sixth surface 522 of the electroplated copper layer 52.

In at least one exemplary embodiment, the first conductive circuit layer 20 is defined as the third surface 511 of the metal layer 51 formed on the first surface 111 and the electroplated copper layer 52 formed on the third surface 511 of the metal layer 51. That is to say, the first conductive circuit layer 20 is formed on the first surface 111.

In at least one exemplary embodiment, the second conductive circuit layer 30 is defined as the fourth surface 512 of the metal layer 51 formed on the second surface 112 and the electroplated copper layer 52 formed on the fourth surface 512 of the metal layer 51. That is to say, the second conductive circuit layer 30 is formed on the second surface 112.

The first conductive circuit layer 20 includes a plurality of first conductive circuits 21. The first conductive circuits 21 have a honeycomb structure 211. The honeycomb structure 211 has a plurality of first honeycomb holes 2111.

The second conductive circuit layer 30 includes a plurality of second conductive circuits 31. The second conductive circuits 31 also have a honeycomb structure 311. The honeycomb structure 311 has a plurality of second honeycomb holes 3111. Each of the second honeycomb holes 3111 corresponds to one of the first honeycomb holes 2111.

The length- and width-deformable printed circuit board 100 further includes a plurality of conductive via holes 40. The conductive via holes 40 run through the elastic base layer 11 and correspond to one of the first honeycomb holes 2111 and one of the second honeycomb holes 3111. So, each of the conductive via holes 40 is electrically connected to one of the first conductive circuit 21 and one corresponding second conductive circuits 31.

The plurality of first honeycomb holes 2111, the plurality of second honeycomb holes 3111, and the plurality of conductive via holes 40 are filled by the first elastic cover layer 12 and the second elastic cover layer 13.

Figure 3:
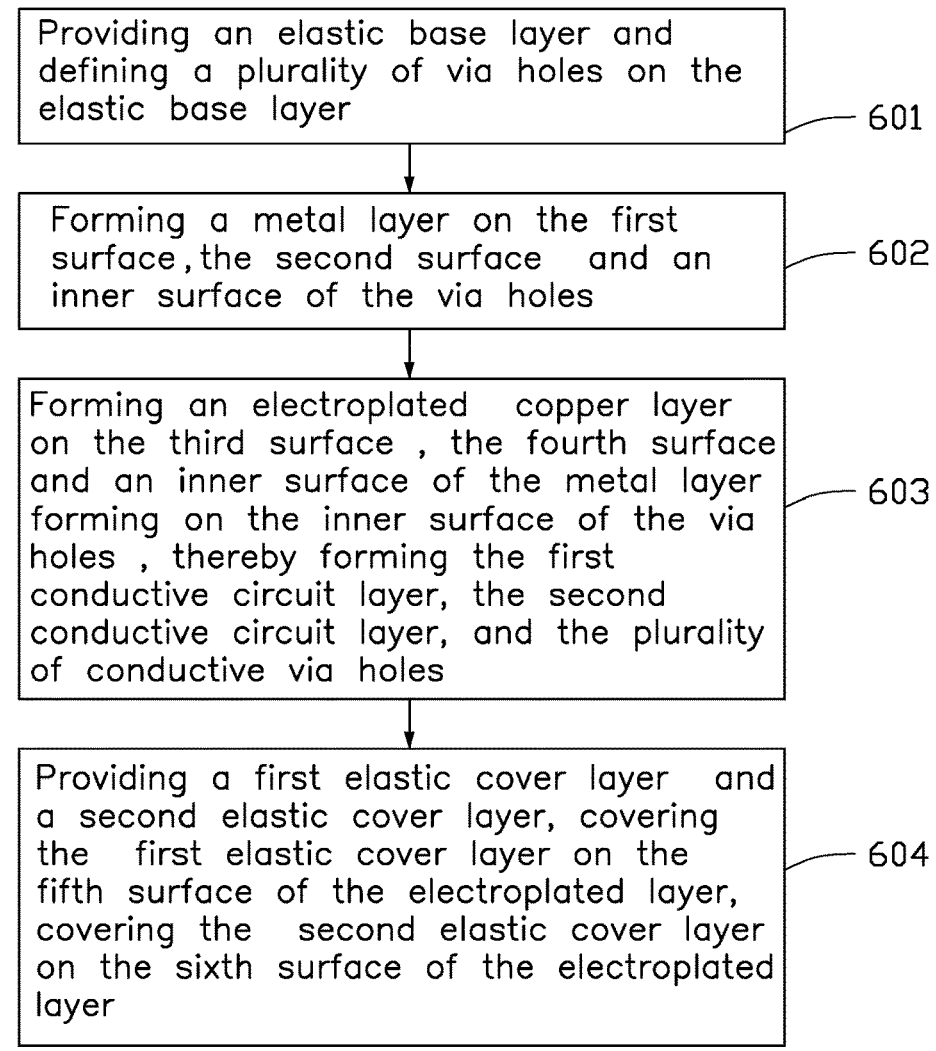
FIG. 3 is a flowchart of an exemplary embodiment of a method for manufacturing the length- and width-deformable printed circuit board of FIG. 1.

FIG. 3 illustrates a flowchart of a method for manufacturing a length- and width-deformable printed circuit board 100. The method is provided by way of example, as there are a variety of ways to carry out the method. The method described below can be carried out using the configurations illustrated in FIGS. 3-7 and 1, for example, and various elements of these figures are referenced in explaining example method. Each block shown in FIG. 3 represents one or more processes, methods, or subroutines, carried out in the exemplary method. Furthermore, the illustrated order of blocks is by example only and the order of the blocks can change. Additional blocks may be added or fewer blocks may be utilized, without departing from this disclosure. The exemplary method can begin at block 601.

Figure 4:
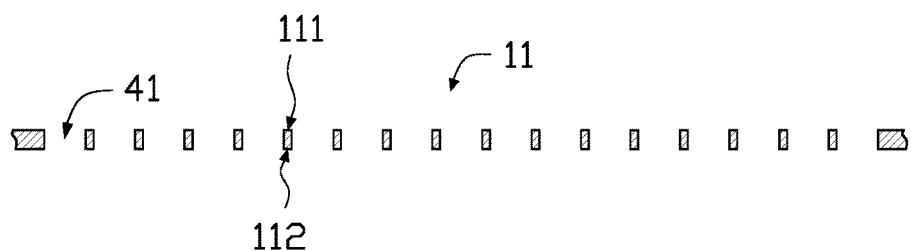
FIG. 4 is a cross-sectional view of an elastic base layer with via holes defined in the elastic base layer of the length- and width-deformable printed circuit board of FIG. 1.
Figure 5:
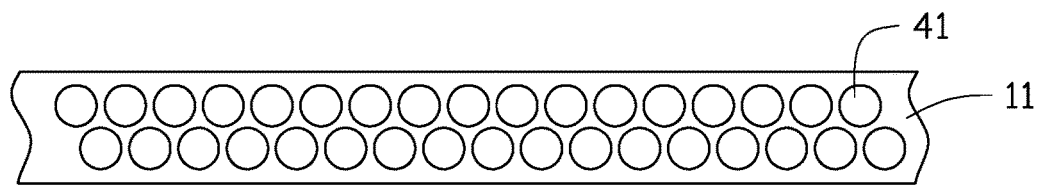
FIG. 5 is a top view of the elastic base layer of FIG. 4.

At block 601, also illustrated by FIGS. 4-5, an elastic base layer 11 is provided. A plurality of via holes 41 are defined in the elastic base layer 11.

The elastic base layer 11 includes a first surface 111 and a second surface 112 facing away from the first surface 111 in FIG. 4.

The via holes 41 run through the elastic base layer 11.

The via holes 41 can be formed by one of machine drilling, laser drilling, and molding.

In at least one exemplary embodiment, the via holes 41 are formed by molding.

In at least one exemplary embodiment, the via holes 41 are circular-shaped in cross-section as shown in FIG. 5.

In other exemplary embodiment, the via holes 41 are square-shaped or rhombic-shaped in cross-section.

In at least one exemplary embodiment, the elastic base layer 11 can be made of polydimethylsiloxane.

Figure 6:
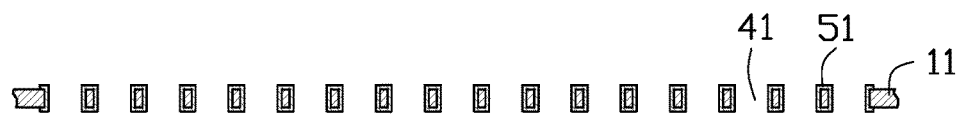
FIG. 6 is a cross-sectional view showing a metal layer formed on an inner surface of the via holes and around the via holes of the elastic base layer of FIG. 5.

At block 602, also illustrated by FIG. 6, a metal layer 51 is formed on the first surface 111, the second surface 112 and an inner surface of the via holes 41.

The metal layer 51 includes a third surface 511 and a fourth surface 512 facing away from the third surface 511. The third surface 511 faces away from the first surface 111 and on the same side with the first surface 111. The fourth surface 512 faces away from the second surface 112 and on the same side with the second surface 112.

In at least one exemplary embodiment, the metal layer 51 is formed by sputtering metal.

The metal can be gold, silver, copper, stannum, titanium, platinum, chromium, aluminum, or nickel.

In at least one exemplary embodiment, the metal layer 51 is a copper layer.

Figure 7:
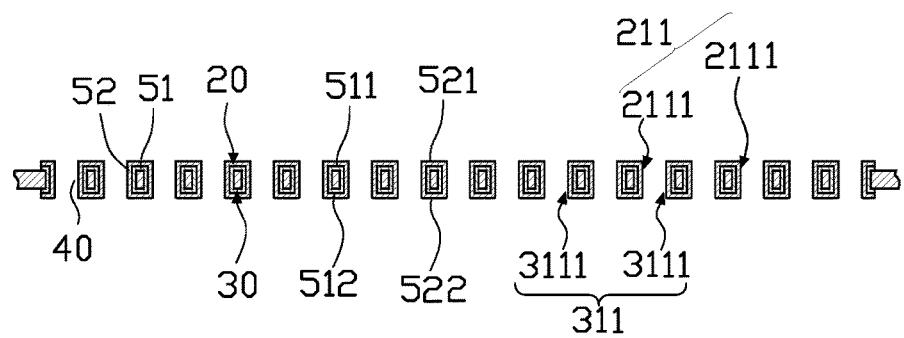
FIG. 7 is a cross-sectional view showing conductive circuit layers formed on the metal layer of FIG. 6.

At block 603, also illustrated by FIG. 7, an electroplated copper layer 52 is formed on the third surface 511, the fourth surface 512 and an inner surface of the metal layer 51 that is formed on the inner surface of the via holes 41, thereby forming the first conductive circuit layer 20, the second conductive circuit layer 30, and the plurality of conductive via holes 40.

In at least one exemplary embodiment, the first conductive circuit layer 20 is defined as the third surface 511 of the metal layer 51 formed on the first surface 111 and the electroplated copper layer 52 formed on the third surface 511 of the metal layer 51. That is to say, the first conductive circuit layer 20 is formed on the first surface 111.

In at least one exemplary embodiment, the second conductive circuit layer 30 is defined as the fourth surface 512 of the metal layer 51 formed on the second surface 112 and the electroplated copper layer 52 formed on the fourth surface 512 of the metal layer 51. That is to say, the second conductive circuit layer 30 is formed on the second surface 112.

The first conductive circuit layer 20 includes a plurality of first conductive circuits 21. The first conductive circuits 21 have a honeycomb structure 211. The honeycomb structure 211 has a plurality of first honeycomb holes 2111.

The second conductive circuit layer 30 includes a plurality of second conductive circuits 31. The second conductive circuits 31 also have a honeycomb structure 311. The honeycomb structure 311 has a plurality of second honeycomb holes 3111. Each of the second honeycomb holes 3111 corresponds to one of the first honeycomb holes 2111.

The conductive via holes 40 run through the elastic base layer 11 and correspond to one of the first honeycomb holes 2111 and one of the second honeycomb holes 3111. So, each of the conductive via holes 40 is electrically connected to one of the first conductive circuit 21 and the corresponding second conductive circuits 31.

At block 604, also illustrated by FIG. 1, a first elastic cover layer 12 and a second elastic cover layer 13 are provided. The first elastic cover layer 12 is covered on the fifth surface 521 of the electroplated copper layer 52. The second elastic cover layer 13 is covered on the sixth surface 522 of the electroplated copper layer 52.

The first elastic cover layer 12 and the second elastic cover layer 13 fill in the plurality of first honeycomb holes 2111, the plurality of second honeycomb holes 3111 and the plurality of conductive via holes 40.

In at least one exemplary embodiment, the first elastic cover layer 12, and the second elastic cover layer 13 are made of polydimethylsiloxane.

In other exemplary embodiments, the electroplated copper layer 52 can be omitted.

With the above configuration, the length- and width-deformable printed circuit board 100 is made of polydimethylsiloxane, the elastic film has a plurality of conductive via holes 40, and the first and the second conductive circuit layers 20, 30 have a plurality of honeycomb holes 2111, 3111, the plurality of conductive via holes 40 corresponds to one of the honeycomb holes 2111, 3111. When the length- and width-deformable printed circuit board 100 is stretched along a first direction, the first and the second conductive circuits 21, 31 are also stretched along the first direction, but the honeycomb holes 2111, 3111 are compressed along a second direction which is perpendicular to the first direction. So, 1) the length- and width-deformable printed circuit board 100 is length- and width-deformable along any direction; 2) breaks or cracks of the first and the second conductive circuits 21, 31 can be prevented when the length- and width-deformable printed circuit board 100 is stretched, and a signal transmission stability of can be further improved.

The embodiments shown and described above are only examples. Many details are often found in the art such as the other features of the lead frame and light emitting diode package having the same. Therefore, many such details are neither shown nor described. Even though numerous characteristics and advantages of the present disclosure have been positioned forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims. It will therefore be appreciated that the embodiments described above can be modified within the scope of the claims.

What is claimed is:

1. A method for manufacturing a length- and width-deformable printed circuit board comprising:
    providing an elastic base layer and defining a plurality of via holes on the elastic base layer, the elastic base layer comprising a first surface and a second surface facing away from the first surface;
    forming a first conductive circuit layer by forming a metal layer on the first surface, and further forming the metal layer on an inner surface of each of the plurality of via holes to form a plurality of conductive via holes, the first conductive circuit layer comprising a plurality of first conductive circuits, the plurality of first conductive circuits comprising a plurality of first honeycomb holes, wherein the each of the plurality of conductive via holes corresponds to one of the first honeycomb holes;
    providing a first elastic cover layer, the first elastic cover layer covering on the first conductive circuit layer and filling the conductive via holes and the plurality of first honeycomb holes; wherein when the length- and width-deformable printed circuit board is stretched along a first direction, the first conductive circuit is also stretched along the first direction, but the first honeycomb holes are compressed along a second direction which is perpendicular to the first direction;
    forming a second conductive circuit layer by forming the metal layer on the second surface, wherein the second conductive circuit layer comprises a plurality of second conductive circuits, the plurality of second conductive circuits comprising a plurality of second honeycomb holes, each second honeycomb hole corresponding to each first honeycomb hole;
    providing a second elastic cover layer, the second elastic cover layer covering the second conductive circuit layer; wherein the metal layer comprises a third surface and a fourth surface facing away from the third surface, the third surface faces away from the first surface on the same side as the first surface, and the fourth surface faces away from the second surface on the same side as the second surface; and
    forming an electroplated copper layer on the third surface of the metal layer as the first conductive circuit layer, and forming the electroplated copper layer on the fourth surface of the metal layer as the second conductive circuit layer.

2. The method of claim 1, wherein the first elastic cover layer fills in the first honeycomb holes, a second elastic cover layer fills in the second honeycomb holes.

3. The method of claim 1, wherein the electroplated copper layer comprises a fifth surface and a sixth surface facing away from the fifth surface, the fifth surface faces away from the third surface and on the same side with the first surface and the third surface, the sixth surface faces away from the fourth surface and on the same side with the fourth surface and the second surface, the first elastic cover layer is covered on the fifth surface of the electroplated copper layer, the second elastic cover layer is covered on the sixth surface of the electroplated copper layer.

4. The method of claim 1, wherein the metal layer is formed by sputtering metal.

5. The method of claim 4, wherein the metal is selected from a group consisting of one of gold, silver, copper, stannum, titanium, platinum, chromium, aluminum, and nickel.

6. The method of claim 1, wherein the elastic base layer, the first elastic cover layer, and the second elastic cover layer are made of polydimethylsiloxane.

* * * * *